United States Patent
Sasaki et al.

(10) Patent No.: US 10,358,742 B2
(45) Date of Patent: Jul. 23, 2019

(54) $GA_2O_3$-BASED CRYSTAL FILM, AND CRYSTAL MULTILAYER STRUCTURE

(71) Applicants: TAMURA CORPORATION, Tokyo (JP); Novel Crystal Techonology, Inc., Saitama (JP)

(72) Inventors: Kohei Sasaki, Tokyo (JP); Daiki Wakimoto, Tokyo (JP)

(73) Assignees: TAMURA CORPORATION, Tokyo (JP); Novel Crystal Technology, Inc., Saitama (JP)

( * ) Notice: Subject to any disclaimer, the term of this patent is extended or adjusted under 35 U.S.C. 154(b) by 0 days.

(21) Appl. No.: 15/611,952

(22) Filed: Jun. 2, 2017

(65) Prior Publication Data

US 2017/0350037 A1 Dec. 7, 2017

(30) Foreign Application Priority Data

Jun. 3, 2016 (JP) ................. 2016-111972

(51) Int. Cl.
*H01L 21/02* (2006.01)
*C30B 23/06* (2006.01)
(Continued)

(52) U.S. Cl.
CPC .............. *C30B 23/06* (2013.01); *C23C 14/08* (2013.01); *C23C 14/28* (2013.01); *C30B 23/025* (2013.01);
(Continued)

(58) Field of Classification Search
CPC ......... H01L 21/02414; H01L 21/02483; H01L 21/02565; H01L 21/02576; H01L 21/02631; H01L 21/02584
See application file for complete search history.

(56) References Cited

U.S. PATENT DOCUMENTS

| 2014/0331919 A1 | 11/2014 | Sasaki | |
| 2015/0325659 A1* | 11/2015 | Hitora | ................. H01L 29/7828 257/43 |
| 2016/0265137 A1* | 9/2016 | Goto | ....................... C23C 16/40 |

FOREIGN PATENT DOCUMENTS

| JP | WO 2013/080972 A1 | 6/2013 |
| WO | WO 2014132970 | * 9/2014 |

OTHER PUBLICATIONS

Kohei Sasaki et al, "Si-Ion Implantation Doping in .beta.-Ga.sub.2O.sub.3 and Its Application to Fabrication of Low-Resistance Ohmic Contacts," Applied Physics Express 6 (2013) 086502 (Year: 2013).*

(Continued)

*Primary Examiner* — Kyoung Lee
*Assistant Examiner* — Christina A Sylvia
(74) *Attorney, Agent, or Firm* — Scully Scott Murphy and Presser (57) ABSTRACT

A method of growing a conductive $Ga_2O_3$-based crystal film by MBE includes producing a Ga vapor and a Si-containing vapor and supplying the vapors as molecular beams onto a surface of a $Ga_2O_3$-based crystal substrate so as to grow the $Ga_2O_3$-based crystal film. The $Ga_2O_3$-based crystal film includes a Si-containing $Ga_2O_3$-based single crystal film. The Si-containing vapor is produced by heating Si or a Si compound and Ga while allowing the Si or a Si compound to contact with the Ga.

7 Claims, 6 Drawing Sheets

(51) Int. Cl.
    *C23C 14/08*     (2006.01)
    *C23C 14/28*     (2006.01)
    *C30B 23/02*     (2006.01)
    *C30B 29/16*     (2006.01)
    *H01L 29/24*     (2006.01)
    *H01L 29/36*     (2006.01)
    *H01L 29/778*    (2006.01)

(52) U.S. Cl.
    CPC ........ *C30B 29/16* (2013.01); *H01L 21/02414* (2013.01); *H01L 21/02483* (2013.01); *H01L 21/02565* (2013.01); *H01L 21/02576* (2013.01); *H01L 21/02584* (2013.01); *H01L 21/02631* (2013.01); *H01L 29/24* (2013.01); *H01L 29/36* (2013.01); *H01L 29/365* (2013.01); *H01L 29/7787* (2013.01)

(56) References Cited

OTHER PUBLICATIONS

Villora, E.G. et al., "Electrical conductivity and carrier concentration control in .beta.-Ga.sub.2O.sub.3 by Si doping," (2008) Applied Physics Letters. 92(20):202120-202500 (Year: 2008).*

* cited by examiner

GA₂O₃-BASED CRYSTAL FILM, AND CRYSTAL MULTILAYER STRUCTURE

The present application is based on Japanese patent application No. 2016-111972 filed on Jun. 3, 2016, the entire contents of which are incorporated herein by reference.

BACKGROUND OF THE INVENTION

1. Field of the Invention

The invention relates to a method of growing a $Ga_2O_3$-based crystal film and a crystal multilayer structure grown by the method.

2. Description of the Related Art

A method of growing a $Ga_2O_3$-based crystal film is known which uses MBE and Sn as a dopant (see e.g. WO2013/080972).

WO2013/080972 states that if Si is used as a dopant, it is difficult to control the vapor pressure of vaporized Si source such as Si, SiO and $SiO_2$ to control the Si concentration of the $Ga_2O_3$-based crystal film. Also it states that, therefore, Sn is used as the dopant instead of using Si so as to control the carrier concentration of the $Ga_2O_3$-based crystal film with high accuracy.

SUMMARY OF THE INVENTION

When Sn is used as the dopant for the $Ga_2O_3$-based crystal film, a problem may arise that Sn is difficult to introduce into the film (i.e., doping delayed) at the initial growth stage of the $Ga_2O_3$-based crystal film and is likely to segregate on the growth surface.

It is an object of the invention to provide a method of growing by MBE a $Ga_2O_3$-based crystal film that allows the highly accurate control of a dopant concentration so as to enhance the uniformity of dopant concentration distribution, as well as a crystal multilayer structure grown by the method.

According to an embodiment of the invention, a method of growing a $Ga_2O_3$-based crystal film by MBE defined by [1] to [4] below is provided.

[1] A method of growing a conductive $Ga_2O_3$-based crystal film by MBE, comprising producing a Ga vapor and a Si-containing vapor and supplying the vapors as molecular beams onto a surface of a $Ga_2O_3$-based crystal substrate so as to grow the $Ga_2O_3$-based crystal film, wherein the $Ga_2O_3$-based crystal film comprises a Si-containing $Ga_2O_3$-based single crystal film, and wherein the Si-containing vapor is produced by heating Si or a Si compound and Ga while allowing the Si or the Si compound to contact with the Ga.

[2] The method according to [1], wherein the Si compound is provided as a cell of an MBE apparatus comprising $SiO_2$, and wherein the Si-containing vapor is produced by heating the cell and the Ga enclosed by the cell while allowing the cell to contact with the Ga.

[3] The method according to [1], wherein the Si-containing vapor is produced by heating a cell of an MBE apparatus and the Si or the Si compound and the Ga which are enclosed by the cell while allowing the Si or the Si compound to contact with the Ga.

[4] The method according to [3], wherein the Si compound comprises one of SiO and $SiO_2$.

According to another embodiment of the invention, a crystal multilayer structure defined by [5] below is provided.

[5] A crystal multilayer structure, comprising:
a $Ga_2O_3$-based crystal substrate;
an undoped $Ga_2O_3$-based crystal film grown on the $Ga_2O_3$-based crystal substrate;
a first undoped $(AlGa)_2O_3$ crystal film grown directly on the undoped $Ga_2O_3$-based crystal film;
a Si-doped $(AlGa)_2O_3$ crystal film grown directly on the first undoped $(AlGa)_2O_3$ crystal film, the Si-doped $(AlGa)_2O_3$ crystal film having a thickness of not more than 10 nm and comprising Si at a concentration of not less than $3.0 \times 10^{17}/cm^3$ and not more than $3.5 \times 10^{19}/cm^3$; and
a second undoped $(AlGa)_2O_3$ crystal film grown directly on the $(AlGa)_2O_3$ crystal film.

Effects of the Invention

According to an embodiment of the invention, a method of growing by MBE a $Ga_2O_3$-based crystal film can be provided that allows the highly accurate control of a dopant concentration so as to enhance the uniformity of dopant concentration distribution, as well as a crystal multilayer structure grown by the method.

BRIEF DESCRIPTION OF THE DRAWINGS

Next, the present invention will be explained in more detail in conjunction with appended drawings, wherein.

DETAILED DESCRIPTION OF THE PREFERRED EMBODIMENTS

First Embodiment

Ga₂O₃-Based Crystal Film

Figure 1:
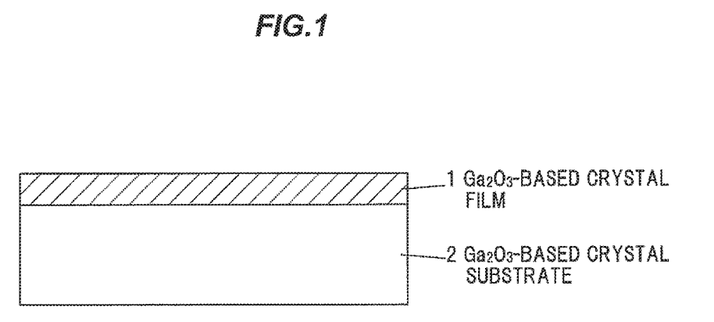
FIG. 1 is a vertical cross sectional view showing a $Ga_2O_3$-based crystal substrate and a $Ga_2O_3$-based crystal film in a first embodiment.

FIG. 1 is a vertical cross sectional view showing a $Ga_2O_3$-based crystal substrate and a $Ga_2O_3$-based crystal film in the first embodiment.

A $Ga_2O_3$-based crystal film 1 is formed by epitaxially growing a $Ga_2O_3$-based single crystal on a $Ga_2O_3$-based crystal substrate 2 by MBE. MBE is a crystal growth method in which raw materials as pure element or compound are heated in evaporators called cells and vapors generated by heat are supplied in the form of molecular beams onto the surface of the substrate to epitaxially grow a crystal.

The $Ga_2O_3$-based crystal film 1 is formed of an n-type β-$Ga_2O_3$-based single crystal containing Si as a dopant. The $Ga_2O_3$-based single crystal here is a $Ga_2O_3$ single crystal, or a $Ga_2O_3$ single crystal doped with an element such as Al and In, and may be, e.g., a $(Ga_xAl_yIn_{(1-x-y)})_2O_3$ ($0<x\leq1$, $0\leq y<1$, $0<x+y\leq1$) single crystal which is a $Ga_2O_3$ single crystal doped with Al and In. The band gap is widened by adding Al and is narrowed by adding In.

The $Ga_2O_3$-based crystal substrate 2 is formed of a β-$Ga_2O_3$-based single crystal and may contain various dopants according to the type of device for which the $Ga_2O_3$-based crystal film 1 and the $Ga_2O_3$-based crystal substrate 2 are used. For example, Mg, etc., may be added as a dopant to increase resistance of the $Ga_2O_3$-based crystal substrate 2 when the $Ga_2O_3$-based crystal film 1 and the $Ga_2O_3$-based crystal substrate 2 are used in a lateral semiconductor device, and Si or Sn, etc., may be added as a dopant to decrease resistance of the $Ga_2O_3$-based crystal substrate 2 when the $Ga_2O_3$-based crystal film 1 and the $Ga_2O_3$-based crystal substrate 2 are used in a vertical semiconductor device.

The $Ga_2O_3$-based crystal substrate 2 is cut out from, e.g., a doped β-$Ga_2O_3$ single crystal ingot made by the EFG method. The β-$Ga_2O_3$ single crystal ingot may alternatively be made by the FZ method. The obtained ingot is sliced to a thickness of, e.g., about 1 mm so that the principal surface has a desired plane orientation, thereby formed into a substrate. Then, a grinding and polishing process is performed to a thickness of about 300 to 600 µm.

Method of Manufacturing $Ga_2O_3$-Based Crystal Film

Figure 2:
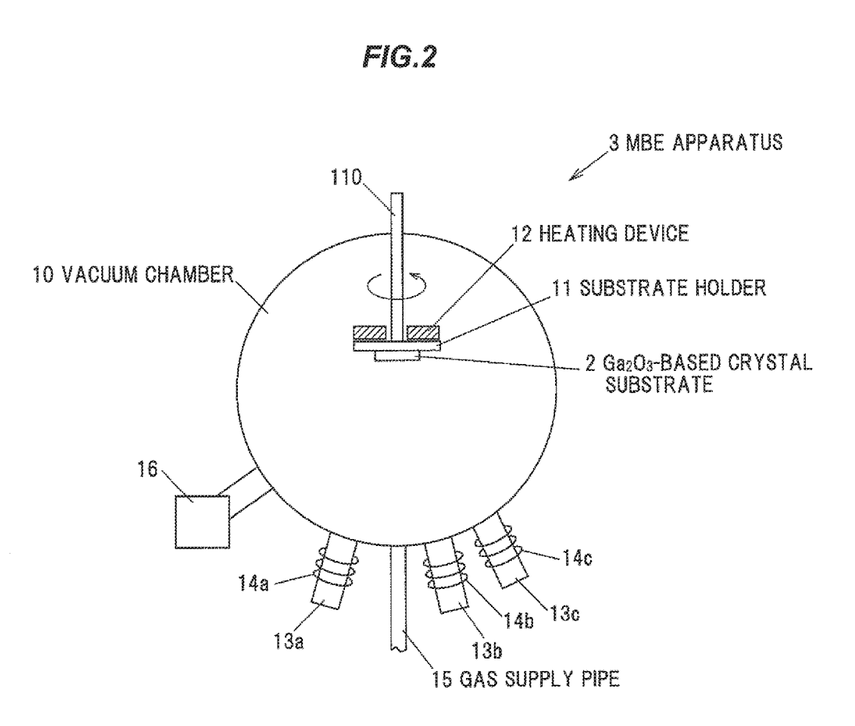
FIG. 2 is a diagram illustrating an exemplary configuration of an MBE apparatus used for growing the $Ga_2O_3$-based crystal film.

FIG. 2 shows an exemplary configuration of an MBE apparatus used for growing the $Ga_2O_3$-based crystal film. An MBE apparatus 3 is provided with a vacuum chamber 10, a substrate holder 11 supported in the vacuum chamber 10 and provided to hold the $Ga_2O_3$-based crystal substrate 2, a heating device 12 held on the substrate holder 11 and provided to heat the $Ga_2O_3$-based crystal substrate 2, plural cells 13 (13a, 13b, 13c) filled with source atoms constituting the $Ga_2O_3$-based crystal film 1, heaters 14 (14a, 14b, 14c) for hearing the cells 13, a gas supply pipe 15 for supplying oxygen-based gas into the vacuum chamber 10, and a vacuum pump 16 for exhausting the air from the vacuum chamber 10. It is configured that the substrate holder 11 can be rotated by a motor (not shown) via a shaft 110.

The first cell 13a contains Ga as a Ga source for the $Ga_2O_3$-based crystal film 1. The form of Ga contained in the first cell 13a is not specifically limited and is typically a solid such as powder or particles. The first cell 13a is formed of, e.g., PBN (Pyrolytic Boron Nitride).

The second cell 13b is formed of $SiO_2$ and is used as a source of Si added to the $Ga_2O_3$-based crystal film 1. The second cell 13b contains Ga. The form of Ga contained in the second cell 13b is not specifically limited and is typically a solid such as powder or particles. Generally, the amount of Ga in the second cell 13b is about half the maximum capacity of the second cell 13b.

The third cell 13c contains a material other than Ga and Si, e.g., contains an Al source when the $Ga_2O_3$-based crystal film 1 is formed of a β-$(Al_xGa_{1-x})_2O_3$ single crystal. It is not necessary to provide the third cell 13c when the $Ga_2O_3$-based crystal film 1 is formed of a β-$Ga_2O_3$ single crystal.

A shutter is provided at an opening of each of the first cell 13a, the second cell 13b and the third cell 13c.

Firstly, the preliminarily-formed $Ga_2O_3$-based crystal substrate 2 is attached to the substrate holder 11 of the MBE apparatus 3. Next, the vacuum pump 16 is activated to reduce atmospheric pressure in the vacuum chamber 10 to about $1\times10^{-8}$ Pa. Then, the $Ga_2O_3$-based crystal substrate 2 is heated by the heating device 12. Here, radiation heat from heat source such as graphite heater of the heating device 12 is thermally transferred to the $Ga_2O_3$-based crystal substrate 2 via the substrate holder 11 and the $Ga_2O_3$-based crystal substrate 2 is thereby heated.

After the $Ga_2O_3$-based crystal substrate 2 is heated to a predetermined temperature, an oxygen-based gas such as ozone gas or oxygen radical is supplied into the vacuum chamber 10 through the gas supply pipe 15. Partial pressure of the oxygen-based gas is, e.g., $5\times10^{-4}$ Pa.

After a period of time required for stabilization of gas pressure in the vacuum chamber 10 (e.g., after 5 minutes), the first cell 13a, the second cell 13b and, if necessary, the third cell 13c are heated by the heaters 14 while rotating the substrate holder 11 so that vapors containing raw materials of the $Ga_2O_3$-based crystal film 1 are produced and are radiated as molecular beams onto the surface of the $Ga_2O_3$-based crystal substrate 2. Accordingly, a β-$Ga_2O_3$-based single crystal is epitaxially grown on the $Ga_2O_3$-based crystal substrate 2 while being doped with Si, and the $Ga_2O_3$-based crystal film 1 is thereby formed.

The first cell 13a is heated to, e.g., 900° C. so that Ga contained in the first cell 13a produces a Ga vapor. The beam-equivalent pressure (BEP) of the Ga vapor is $2\times10^{-4}$ Pa.

The second cell 13b is heated to, e.g., 600 to 900° C. so that the second cell 13b formed of $SiO_2$ and Ga contained in the second cell 13b produce a vapor containing Si and Ga (hereinafter, referred to as "Si-containing vapor"). Controlling the beam-equivalent pressure of the Si-containing vapor by changing the heating temperature of the second cell 13b will control the Si concentration in the $Ga_2O_3$-based crystal film 1.

Here, the second cell 13b and Ga contained therein are heated in the contact state and produce the Si-containing vapor. By using the Si-containing vapor produced as such, it is possible to highly accurately control the Si concentration in the $Ga_2O_3$-based crystal film 1 and also possible to obtain higher uniformity of Si concentration distribution.

When using, e.g., a Si vapor which is produced by using the second cell 13b formed of $SiO_2$ and not containing Ga, or a Si vapor which is produced by using a cell formed of PBN, etc., and containing a Si source such as Si, SiO or $SiO_2$, the Si concentration in the $Ga_2O_3$-based crystal film 1 cannot be controlled with high accuracy. Also, when using Sn as a dopant, doping delay occurs and Sn may segregate in the $Ga_2O_3$-based crystal film 1, as mentioned previously.

The present inventors has experimentally confirmed the effect of using the Si-containing vapor produced by the above-described method.

The β-$Ga_2O_3$-based single crystal constituting the $Ga_2O_3$-based crystal film 1 is grown at, e.g., a growth temperature of 540° C. and a growth rate of 0.01 to 10 µm/h.

By controlling the Si concentration in the $Ga_2O_3$-based crystal film 1, the effective donor concentration $N_d-N_a$ (obtained by subtracting the acceptor concentration $N_a$ from the donor concentration $N_d$) is controlled in the range of, e.g., $1\times10^{15}$ to $1\times10^{20}/cm^3$.

Second Embodiment

The method of producing the Si-containing vapor in a second embodiment is different from that in the first embodiment. Since the other features are the same as the first embodiment, the explanation thereof will be omitted or simplified.

In the second embodiment, the second cell 13b may not be formed of $SiO_2$ and is formed of, e.g., PBN. Then, the second cell 13b contains Si or a Si compound and Ga. The Si compound is SiO, $SiO_2$ or a mixture thereof. The form of Si and the Si compound is not specifically limited and is typically a solid such as powder or particles.

Si or Si compound and Ga contained in the second cell 13b are heated in the contact state and produce the Si-containing vapor. The feature in which the Si-containing vapor is produced by heating a Si source and Ga in the contact state is in common with the first embodiment.

Third Embodiment

The third embodiment is a crystal multilayer structure formed using the methods of growing a $Ga_2O_3$-based crystal film in the first and second embodiments.

Figure 3:
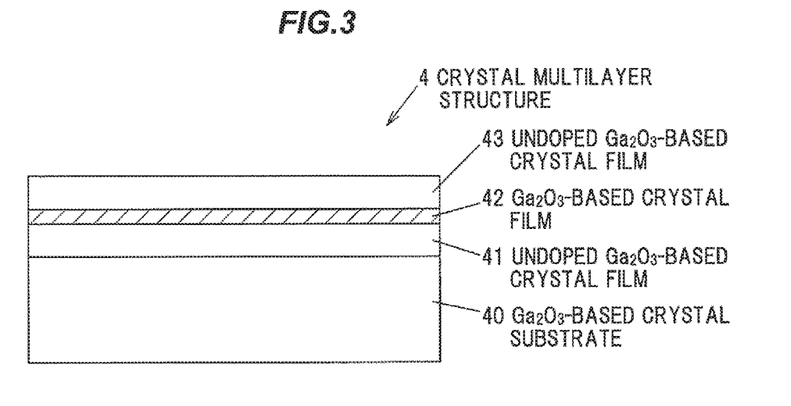
FIG. 3 is a vertical cross sectional view showing a crystal multilayer structure in a third embodiment.

FIG. 3 is a vertical cross sectional view showing a crystal multilayer structure 4 in the third embodiment. The crystal multilayer structure 4 has a $Ga_2O_3$-based crystal substrate 40, an undoped $Ga_2O_3$-based crystal film 41 grown on the $Ga_2O_3$-based crystal substrate 40, a $Ga_2O_3$-based crystal film 42 containing Si as a dopant and grown directly on the undoped $Ga_2O_3$-based crystal film 41, and a second undoped $Ga_2O_3$-based crystal film 43 grown directly on the $Ga_2O_3$-based crystal film 42.

A laminated structure composed of the undoped $Ga_2O_3$-based crystal film 41, the $Ga_2O_3$-based crystal film 42 and the undoped $Ga_2O_3$-based crystal film 43 is grown by starting and stopping addition of a dopant in the middle of the growth of a $Ga_2O_3$ crystal on the $Ga_2O_3$-based crystal substrate 40. The term "undoped" here means that any intentionally added dopant is not contained, and the undoped crystal films do not have a dopant concentration which affects conductivity.

Another $Ga_2O_3$-based crystal film may be additionally provided between the $Ga_2O_3$-based crystal substrate 40 and the undoped $Ga_2O_3$-based crystal film 41.

The Si concentration in the $Ga_2O_3$-based crystal film 42 is, e.g., not less than $3.0 \times 10^{17}/cm^3$ and not more than $3.5 \times 10^{19}/cm^3$.

Also, the thickness of the $Ga_2O_3$-based crystal film 42 is not more than 10 nm. This means that the laminated structure composed of the undoped $Ga_2O_3$-based crystal film 41, the $Ga_2O_3$-based crystal film 42 and the undoped $Ga_2O_3$-based crystal film 43 can be grown only by using the methods of growing a $Ga_2O_3$-based crystal film in the first and second embodiments in which the Si concentration can be controlled with high accuracy.

Examples of the method of forming a $Ga_2O_3$-based crystal film other than the MBE method include the PLD (Pulsed Laser Deposition) method, the sputtering method, the MOCVD (Metal Organic Chemical Vapor Deposition) method, the thermal CVD method, the plasma CVD method and the HVPE (Halide Vapor Phase Epitaxy) method, etc., but it is difficult to manufacture the crystal multilayer structure 4 by these methods.

In, e.g., the PLD method and the sputtering method, purity of the film depends on purity of a $Ga_2O_3$-ceramic target that is a source for forming the film. However, since any high purity $Ga_2O_3$ target does not currently exist in the world, it is not possible to avoid mixture of unignorable level of impurities and it is thus not possible to form the undoped $Ga_2O_3$-based crystal films 41 and 43.

Also, in the MOCVD method, the thermal CVD method and the plasma CVD method, impurities from source gases are mixed and, also in this case, it is not possible to form the undoped $Ga_2O_3$-based crystal films 41 and 43. In the HVPE method, it is possible to form the undoped $Ga_2O_3$-based crystal films 41 and 43, but it is difficult to form the $Ga_2O_3$-based crystal film 42 having a thickness of not more than 10 nm since it is not possible to reduce the growth rate.

Figure 4:
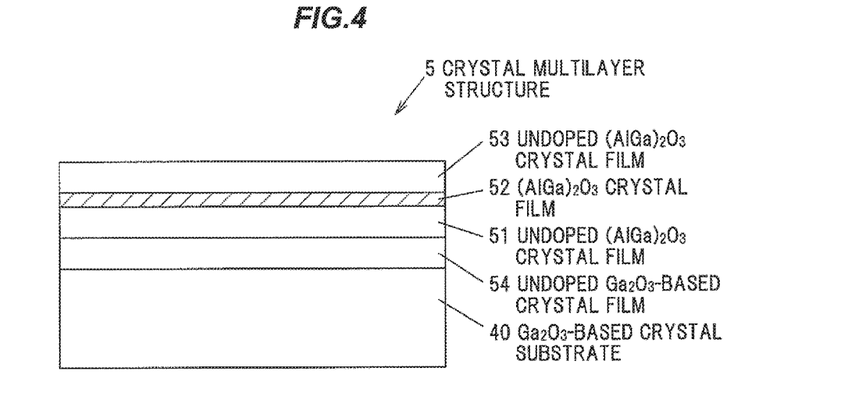
FIG. 4 is a vertical cross sectional view showing a specific example of the crystal multilayer structure in the third embodiment.

FIG. 4 is a vertical cross sectional view showing a crystal multilayer structure 5 which is a specific example of the crystal multilayer structure 4. The crystal multilayer structure 5 is suitable for manufacturing, e.g., HEMT (High Electron Mobility Transistor).

The crystal multilayer structure 5 has the $Ga_2O_3$-based crystal substrate 40, an undoped $Ga_2O_3$-based crystal film 54 grown on the $Ga_2O_3$-based crystal substrate 40, an undoped $(AlGa)_2O_3$ crystal film 51 grown directly on the undoped $Ga_2O_3$-based crystal film 54, an $(AlGa)_2O_3$ crystal film 52 grown directly on the undoped $(AlGa)_2O_3$ crystal film 51, and an undoped $(AlGa)_2O_3$ crystal film 53 grown directly on the $(AlGa)_2O_3$ crystal film 52. The $(AlGa)_2O_3$ crystal film 52 has a thickness of not more than 10 nm and contains Si at a concentration of not less than $3.0 \times 10^{17}/cm^3$ and not more than $3.5 \times 10^{19}/cm^3$.

The crystal multilayer structure 5 has the undoped $(AlGa)_2O_3$ crystal film 51, the $(AlGa)_2O_3$ crystal film 52 and the undoped $(AlGa)_2O_3$ crystal film 53 which are respectively equivalent to the undoped $Ga_2O_3$-based crystal film 41, the $Ga_2O_3$-based crystal film 42 and the undoped $Ga_2O_3$-based crystal film 43 of the crystal multilayer structure 4. Also, the undoped $Ga_2O_3$-based crystal film 54 is additionally grown between the $Ga_2O_3$-based crystal substrate 40 and the undoped $(AlGa)_2O_3$ crystal film 51.

The undoped $(AlGa)_2O_3$ crystal film 51, the $(AlGa)_2O_3$ crystal film 52 and the undoped $(AlGa)_2O_3$ crystal film 53 are formed of $(AlGa)_2O_3$ single crystals. The $(AlGa)_2O_3$ single crystal here means an Al-doped $Ga_2O_3$ single crystal, i.e., an $(Al_zGa_{1-z})_2O_3$ single crystal ($0 \leq z < 1$).

Effects of the Embodiments

In the first and second embodiments, it is possible to provide a method of growing by MBE a $Ga_2O_3$-based crystal film that allows the highly accurate control of the dopant concentration to enhance the uniformity of dopant concentration distribution. In addition, in the third embodiment, by using the methods of growing a $Ga_2O_3$-based crystal film in the first and second embodiments, it is possible to provide a crystal multilayer structure including a laminated structure in which a thin Si-doped $Ga_2O_3$-based crystal film is sandwiched between two undoped $Ga_2O_3$-based crystal films.

Example 1

The dopant concentration distribution in the thickness direction of the $Ga_2O_3$-based crystal film grown by using Si or Sn as a dopant was obtained by SIMS analysis.

In this Example, the crystal multilayer structure 4 shown in FIG. 3 was made using Si as a dopant. In detail, the crystal multilayer structure 4 (sample A) was made in which an Sn-doped $Ga_2O_3$ crystal substrate, a 40 nm-thick undoped $Ga_2O_3$ crystal film, a 5 nm-thick $Ga_2O_3$ crystal film containing Si as a dopant and a 40 nm-thick undoped $Ga_2O_3$ crystal film were respectively provided as the $Ga_2O_3$-based crystal substrate 40, the undoped $Ga_2O_3$-based crystal film 41, the $Ga_2O_3$-based crystal film 42 and the undoped $Ga_2O_3$-based crystal film 43.

Also, a crystal multilayer structure (sample B) was made as Comparative Example in the same manner as the sample A except that a 5 nm-thick $Ga_2O_3$ crystal film containing Sn as a dopant was provided instead of the 5 nm-thick $Ga_2O_3$ crystal film containing Si as a dopant.

The sample A having the Si-doped $Ga_2O_3$ crystal film was made by the method of growing a $Ga_2O_3$-based crystal film in the first embodiment. Also, the sample B having the Sn-doped $Ga_2O_3$ crystal film was made by the method of the first embodiment but a PBN cell containing $SnO_2$ as a source for producing a Sn vapor was used instead of the second cell 13b.

Figure 5A:
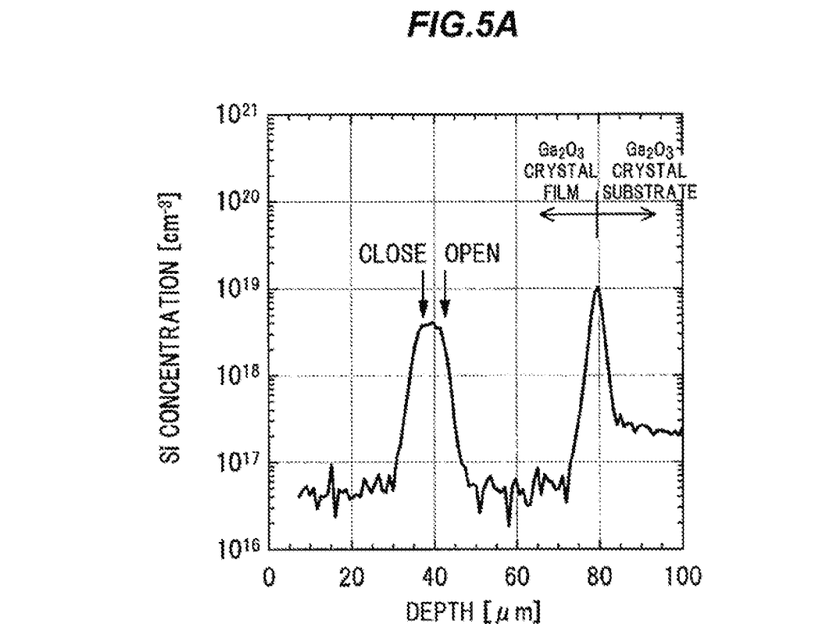
FIG. 5A is a diagram illustrating a concentration distribution of Si added as a dopant in a thickness direction of the $Ga_2O_3$-based crystal film and the $Ga_2O_3$-based crystal substrate.
Figure 5B:
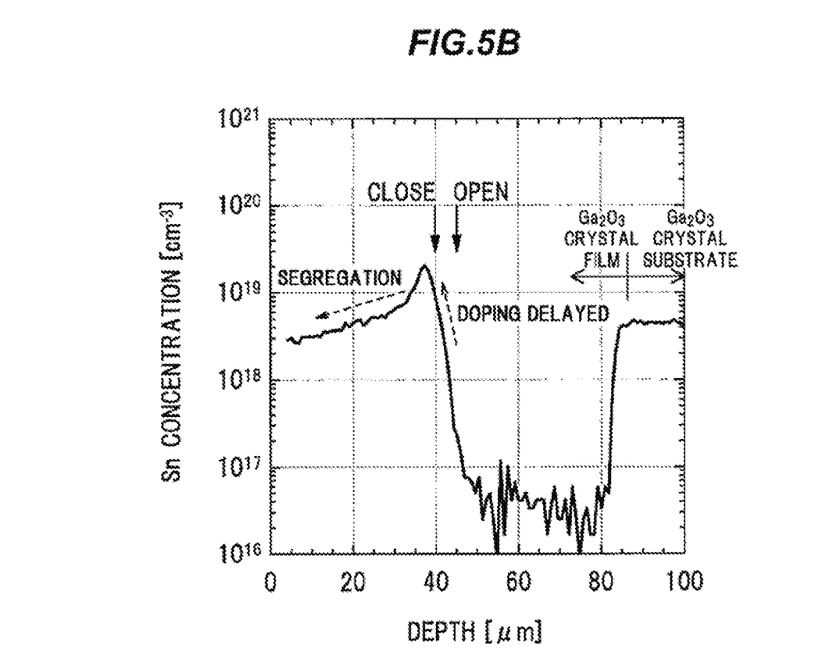
FIG. 5B is a diagram illustrating a concentration distribution of Sn added as a dopant in a thickness direction of the $Ga_2O_3$-based crystal film and the $Ga_2O_3$-based crystal substrate.

FIG. 5A shows Si concentration distribution in a thickness direction in the sample A in which Si is contained as a dopant. FIG. 5B shows Sn concentration distribution in a thickness direction in the sample B in which Sn is contained as a dopant.

In FIGS. 5A and 5B, the horizontal axis indicates a depth from the surface of the $Ga_2O_3$ crystal film. The arrows of "Open" and "Close" in FIG. 5A respectively indicate the position of the surface of the $Ga_2O_3$ crystal film at the moment of opening the shutter of the second cell 13b formed of $SiO_2$ and the position of the surface of the $Ga_2O_3$ crystal film at the moment of closing the shutter. Likewise, the arrows of "Open" and "Close" in FIG. 5B respectively indicate the position of the surface of the $Ga_2O_3$ crystal film at the moment of opening the shutter of the PBN cell containing $SnO_2$ and the position of the surface of the $Ga_2O_3$ crystal film at the moment of closing the shutter.

As shown in FIG. 5A, the Si concentration in the $Ga_2O_3$ crystal film shoots up at the moment of opening the shutter of the second cell 13b and drops at the moment of closing the shutter. This shows that the laminated structure of the sample A was made as designed.

On the other hand, as shown in FIG. 5B, the Sn concentration in the $Ga_2O_3$ crystal film gradually increases from the moment of opening the shutter of the cell containing $SnO_2$ due to doping delay and gradually decreases from the moment of closing the shutter due to segregation on the surface. This shows that the laminated structure of the sample B was not made as designed.

Example 2

An experiment was performed to examine the relation between the heating temperature of the second $SiO_2$ cell 13b containing Ga and the effective donor concentration $N_d-N_a$ in the grown $Ga_2O_3$-based crystal film 1 in the first embodiment.

In this experiment, a Ga metal was used as Ga to be contained in the second cell 13b, and a $Ga_2O_3$ crystal film and a $Ga_2O_3$ crystal substrate were used as the $Ga_2O_3$-based crystal film 1 and the $Ga_2O_3$-based crystal substrate 2.

Figure 6:
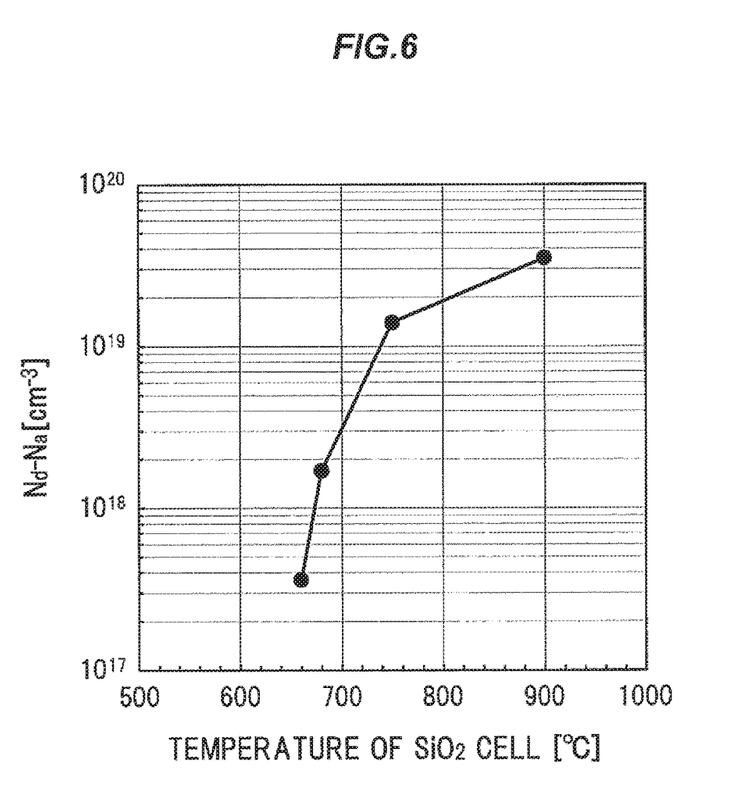
FIG. 6 is a diagram illustrating a relation between an effective donor concentration $N_d-N_a$ in the $Ga_2O_3$ crystal film and temperature of a second cell which is formed of $SiO_2$ and contains Ga powder.

FIG. 6 shows a relation between an effective donor concentration $N_d-N_a$ in the $Ga_2O_3$ crystal film and temperature of the second cell 13b which is formed of $SiO_2$ and contains Ga metal.

The effective donor concentration when the temperature of the second cell 13b is 660° C., 680° C. and 750° C. corresponds to that of the $Ga_2O_3$ crystal film grown using both the first cell 13a and the second cell 13b. Also, the effective donor concentration when the temperature of the second cell 13b is 900° C. corresponds to that of the $Ga_2O_3$ crystal film grown using only the second cell 13b without using the first cell 13a.

In the method of the first embodiment, the effective donor concentration is the maximum when the $Ga_2O_3$ crystal film is grown only using the second cell 13b. Therefore, the effective donor concentration of $3.5 \times 10^{19}$ cm$^{-3}$ obtained when the temperature of the second cell 13b is 900° C. is considered to be substantially equal to the maximum effective donor concentration of the $Ga_2O_3$ crystal film. Also, since the effective donor concentration when the temperature of the second cell 13b is 660° C. is $3.6 \times 10^{17}$ cm$^{-3}$, the minimum controllable effective donor concentration of the $Ga_2O_3$ crystal film is considered to be about $3.0 \times 10^{17}$/cm$^3$ or less. In the $Ga_2O_3$ crystal film, the Si concentration is substantially equal to the effective donor concentration.

The result of the experiment shows that, when using the methods of the first and second embodiments, it is possible to control the effective donor concentration of the $Ga_2O_3$ crystal film at least in the range of not less than $3.0 \times 10^{17}$/cm$^3$ and not more than $3.5 \times 10^{19}$/cm$^3$.

When the second $SiO_2$ cell 13b not containing Ga was heated, Si was not introduced into the $Ga_2O_3$ crystal film even when the temperature was increased to about 1000° C. Probably, this is because enough flux was not generated from the second cell 13b due to low vapor pressure of $SiO_2$.

Based on this result, it was confirmed that the important factors to highly accurately control a dopant concentration in a $Ga_2O_3$-based crystal film are to heat $SiO_2$ and Ga in the contact state, to produce some chemical reaction between Si, Ga and O, and to produce a Si-containing vapor with an appropriate vapor pressure.

Although the embodiments and Examples of the invention have been described, the invention is not intended to be limited to the embodiments and Examples, and the various kinds of modifications can be implemented without departing from the gist of the invention.

In addition, the invention according to claims is not to be limited to the embodiments and Examples. Further, it should be noted that all combinations of the features described in the embodiments and Examples are not necessary to solve the problem of the invention.

What is claimed is:

1. A crystal multilayer structure, comprising:
   a first undoped β-$Ga_2O_3$-based crystal film and a second undoped β-$Ga_2O_3$-based crystal film; and
   a Si-doped β-$Ga_2O_3$-based crystal film disposed between the first and second undoped β-$Ga_2O_3$-based crystal films and having a thickness of not more than 10 nm,
   wherein the Si-doped β-$Ga_2O_3$-based crystal film is doped from an interface with the first undoped β-$Ga_2O_3$-based crystal film to an interface with the second undoped β-$Ga_2O_3$-based crystal film by controlled concentration of Si.

2. The crystal multilayer structure according to claim 1, wherein the Si-doped β-$Ga_2O_3$-based crystal film has an effective donor concentration of $1 \times 10^{15}$/cm$^3$ to $1 \times 10^{20}$/cm$^3$.

3. The crystal multilayer structure according to claim 1, wherein the controlled concentration of Si are from $3.0 \times 10^{17}$/cm$^3$ to $3.5 \times 10^{19}$/cm$^3$ in the Si-doped β-$Ga_2O_3$-based crystal film.

4. The crystal multilayer structure according to claim 1, wherein the first undoped β-$Ga_2O_3$-based crystal film is provided on a β-$Ga_2O_3$-based crystal substrate.

5. The crystal multilayer structure according to claim 1, wherein at least one of the first and second undoped β-$Ga_2O_3$-based crystal films is an undoped β-$Ga_2O_3$ crystal film.

6. The crystal multilayer structure according to claim 1, wherein at least one of the first and second undoped β-$Ga_2O_3$-based crystal films is an undoped β-$(AlGa)_2O_3$-based crystal film.

7. A crystal multilayer structure, comprising:
a $Ga_2O_3$-based crystal substrate;
an undoped $Ga_2O_3$-based crystal film grown on the $Ga_2O_3$-based crystal substrate;
a first undoped $(AlGa)_2O_3$ crystal film grown directly on the undoped $Ga_2O_3$-based crystal film;
a Si-doped $(AlGa)_2O_3$ crystal film grown directly on the first undoped $(AlGa)_2O_3$ crystal film,
the Si-doped $(AlGa)_2O_3$ crystal film having a thickness of not more than 10 nm and comprising Si at a concentration of not less than $3.0 \times 10^{17}/cm^3$ and not more than $3.5 \times 10^{19}/cm^3$; and
a second undoped $(AlGa)_2O_3$ crystal film grown directly on the Si-doped $(AlGa)_2O_3$ crystal film.

\* \* \* \* \*